United States Patent
Narwal et al.

(10) Patent No.: US 11,340,292 B2
(45) Date of Patent: May 24, 2022

(54) SYSTEM AND METHOD FOR PARALLEL TESTING OF ELECTRONIC DEVICE

(71) Applicant: STMicroelectronics International N.V., Geneva (CH)

(72) Inventors: Rajesh Narwal, Greater Noida (IN); Venkata Narayanan Srinivasan, Greater Noida (IN); Srinivas Dhulipalla, Prakasam (IN)

(73) Assignee: STMICROELECTRONICS INTERNATIONAL N.V., Plan-les-Ouates (CH)

(*) Notice: Subject to any disclaimer, the term of this patent is extended or adjusted under 35 U.S.C. 154(b) by 251 days.

(21) Appl. No.: 16/506,264

(22) Filed: Jul. 9, 2019

(65) Prior Publication Data
US 2021/0011080 A1  Jan. 14, 2021

(51) Int. Cl.
| | | |
|---|---|---|
| G01R 31/30 | (2006.01) | |
| G01R 31/3173 | (2006.01) | |
| G01R 31/317 | (2006.01) | |
| G01R 31/319 | (2006.01) | |

(52) U.S. Cl.
CPC ....... *G01R 31/3004* (2013.01); *G01R 31/319* (2013.01); *G01R 31/3173* (2013.01); *G01R 31/31701* (2013.01); *G01R 31/31703* (2013.01)

(58) Field of Classification Search
None
See application file for complete search history.

(56) References Cited

U.S. PATENT DOCUMENTS

| | | | |
|---|---|---|---|
| 6,643,180 B2 | 11/2003 | Ikehashi et al. | |
| 7,212,067 B2 | 5/2007 | Pasternak | |
| 8,044,536 B2 | 10/2011 | Nguyen et al. | |
| 9,335,375 B2 | 5/2016 | Srinivasan | |
| 9,698,771 B1* | 7/2017 | Srinivasan | G06F 1/24 |
| 9,941,875 B2* | 4/2018 | Srinivasan | G06F 1/24 |
| 10,031,189 B1* | 7/2018 | Wang | G01R 31/40 |
| 10,996,266 B2* | 5/2021 | Srinivasan | G01R 31/2856 |
| 11,112,455 B2* | 9/2021 | van Oevelen | H02M 3/158 |
| 2019/0086474 A1* | 3/2019 | Srinivasan | G01R 31/3277 |
| 2019/0094296 A1 | 3/2019 | Srinivasan et al. | |
| 2019/0094301 A1 | 3/2019 | Srinivasan et al. | |
| 2021/0041496 A1* | 2/2021 | Srinivasan | G01R 31/2856 |

* cited by examiner

*Primary Examiner* — Jermele M Hollington
(74) *Attorney, Agent, or Firm* — Slater Matsil, LLP

(57) ABSTRACT

Circuits and methods for testing voltage monitor circuits are provided. In one embodiment, a method includes setting voltage monitor circuits to test mode; setting, a monitor reference in each voltage monitor circuit, to a respective targeted threshold voltage using a corresponding trim code; ramping, a voltage provided to a subset of voltage monitor circuits, from a first voltage to a second voltage using a test voltage supply, voltages between the first voltage and the second voltage corresponding with targeted threshold voltages of the subset of voltage monitor circuits; determining, for each voltage monitor circuit in the subset of voltage monitor circuits, a voltage value of the test voltage supply resulting in a change in a logic state at an output of a corresponding voltage monitor circuit.

20 Claims, 5 Drawing Sheets

SYSTEM AND METHOD FOR PARALLEL TESTING OF ELECTRONIC DEVICE

TECHNICAL FIELD

The present disclosure relates generally to electronic devices, and, in particular embodiments, to systems and methods for parallel testing and trimming multiple voltage monitor circuits in an electronic device.

BACKGROUND

A typical power management unit may include multiple voltage monitor circuits that may be used for a variety of built-in testing operations. Each voltage monitor circuit may be used to monitor a different threshold of the voltage supplied by a respective power supply of the power management unit.

During production and to achieve accurate voltage readings, each voltage monitor circuit is calibrated with a determined trim value, which is typically determined at room temperature conditions.

To verify the integrity of the trimmed values across the entire operation conditions of the power management unit, each voltage monitor circuit, as trimmed, is tested across the operating temperature ranges (e.g., −40° centigrade (C) to +165° C.).

A need exists for systems and methods to reduce trim time and test time in devices having multiple voltage monitor circuits.

SUMMARY

Technical advantages are generally achieved by embodiments of this disclosure, which describe systems and methods for parallel testing and trimming multiple voltage monitor circuits in an electronic device.

A first aspect relates to a method for testing voltage monitor circuits in a device, the method includes setting voltage monitor circuits to test mode; setting, a monitor reference in each voltage monitor circuit, to a respective targeted threshold voltage using a corresponding trim code; ramping, a voltage provided to a subset of voltage monitor circuits, from a first voltage to a second voltage using a test voltage supply, voltages between the first voltage and the second voltage corresponding with targeted threshold voltages of the subset of voltage monitor circuits; determining, for each voltage monitor circuit in the subset of voltage monitor circuits, a voltage value of the test voltage supply resulting in a change in a logic state at an output of a corresponding voltage monitor circuit; and verifying, for each voltage monitor circuit in the subset of voltage monitor circuits, that the determined voltage value corresponds to the targeted threshold voltage of an associated voltage monitor circuit, and based thereon, indicating whether or not the trim code is properly set.

In a first implementation form of the method according to the first aspect, the second voltage is a voltage greater than the first voltage and corresponding to a ramping up of the test voltage supply.

In a second implementation form of the method according to the first aspect as such or any preceding implementation form of the first aspect, the first voltage is a voltage greater than the second voltage and corresponding to a ramping down of the test voltage supply.

In a third implementation form of the method according to the first aspect as such or any preceding implementation form of the first aspect, in each voltage monitor circuit, the monitor reference is compared to the voltage provided from the test voltage supply using a comparator circuit, the change in the logic state corresponding to a change in a digital state of an output of the comparator circuit.

In a fourth implementation form of the method according to the first aspect as such or any preceding implementation form of the first aspect, a trim code for each voltage monitor circuit is stored in a non-volatile memory of the device, the setting the monitor reference in each voltage monitor circuit comprises setting the monitor reference with a corresponding trim code from the non-volatile memory.

In a fifth implementation form of the method according to the first aspect as such or any preceding implementation form of the first aspect, the method further includes setting an operating temperature of the voltage monitor circuits to a minimum operating temperature or a maximum operating temperature of the device before ramping the voltage provided to the subset of voltage monitor circuits.

In a sixth implementation form of the method according to the first aspect as such or any preceding implementation form of the first aspect, the subset of voltage monitor circuits comprises minimum voltage detectors, low voltage detectors, high voltage detectors, or upper voltage detectors.

In a seventh implementation form of the method according to the first aspect as such or any preceding implementation form of the first aspect, each voltage monitor circuit comprises a multiplexer having a first input coupled to the test voltage supply and a second input coupled to a functional voltage supply, the functional voltage supply providing a voltage monitored by the voltage monitor circuit during functional mode.

A second aspect relates to a method for trimming voltage monitor circuits in a device, the method includes determining a subset of voltage monitor circuits having a same targeted threshold voltage; setting a voltage provided to the subset of voltage monitor circuits from a test voltage supply to the targeted threshold voltage; and determining a respective trim code value for each voltage monitor circuit in the subset of voltage monitor circuits by monitoring a change in a logic state at an output of each voltage monitor circuit using a range of trim code values at a monitor reference in each voltage monitor circuit.

In a first implementation form of the method according to the second aspect, the method further includes storing, in a non-volatile memory of the device, a trim code value corresponding to the change in the logic state.

In a second implementation form of the method according to the second aspect as such or any preceding implementation form of the second aspect, the method further includes setting the voltage monitor circuits to test mode.

In a third implementation form of the method according to the second aspect as such or any preceding implementation form of the second aspect, in each voltage monitor circuit, the voltage provided from the test voltage supply is compared to a voltage from the monitor reference at each trim code using a comparator circuit, the change in the logic state corresponding to a change in a digital state of an output of the comparator circuit.

In a fourth implementation form of the method according to the second aspect as such or any preceding implementation form of the second aspect, each voltage monitor circuit comprises a multiplexer having a first input coupled to the test voltage supply and a second input coupled to a functional voltage supply, the functional voltage supply providing a voltage monitored by the voltage monitor circuit during functional mode.

In a fifth implementation form of the method according to the second aspect as such or any preceding implementation form of the second aspect, each trim code is provided from a test data register using a joint test action group (JTAG) interface.

A third aspect relates to a method for testing voltage monitor circuits in a device, the method includes programming each voltage monitor circuit to detect an over-voltage or an under-voltage condition of an input voltage using a corresponding targeted threshold voltage; raising, from a first voltage to a second voltage, an input voltage to a subset of the voltage monitor circuits, the targeted threshold voltage of each of the subset of the voltage monitor circuits being a voltage between the first voltage and the second voltage; and monitoring an output of each voltage monitor circuit in the subset of the voltage monitor circuits for a change in a logic state, and based thereon, determining whether a corresponding trim code is properly set for each voltage monitor circuit.

In a first implementation form of the method according to the third aspect as such, the method further includes setting the voltage monitor circuits to test mode.

In a second implementation form of the method according to the third aspect as such or any preceding implementation form of the third aspect, the subset of the voltage monitor circuits comprises minimum voltage detectors, low voltage detectors, high voltage detectors, or upper voltage detectors.

In a third implementation form of the method according to the third aspect as such or any preceding implementation form of the third aspect, the input voltage to the subset of the voltage monitor circuits is provided from a test voltage supply.

In a fourth implementation form of the method according to the third aspect as such or any preceding implementation form of the third aspect, the method further includes setting an operating temperature of the voltage monitor circuits to a minimum operating temperature or a maximum operating temperature of the device before raising the input voltage to the subset of the voltage monitor circuits.

In a fifth implementation form of the method according to the third aspect as such or any preceding implementation form of the third aspect, the method further includes decreasing, from a first voltage to a second voltage, an input voltage to a subset of the voltage monitor circuits, the targeted threshold voltage being a voltage between the first voltage and the second voltage; and monitoring an output of each voltage monitor circuit in the subset of the voltage monitor circuits for a change in a logic state, and based thereon, determining whether a corresponding trim code is properly set for each voltage monitor circuit.

Embodiments can be implemented in hardware, software, or in any combination thereof. A computer program can perform the operations hereinabove. A device can be programmably-arranged to perform the computer program.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
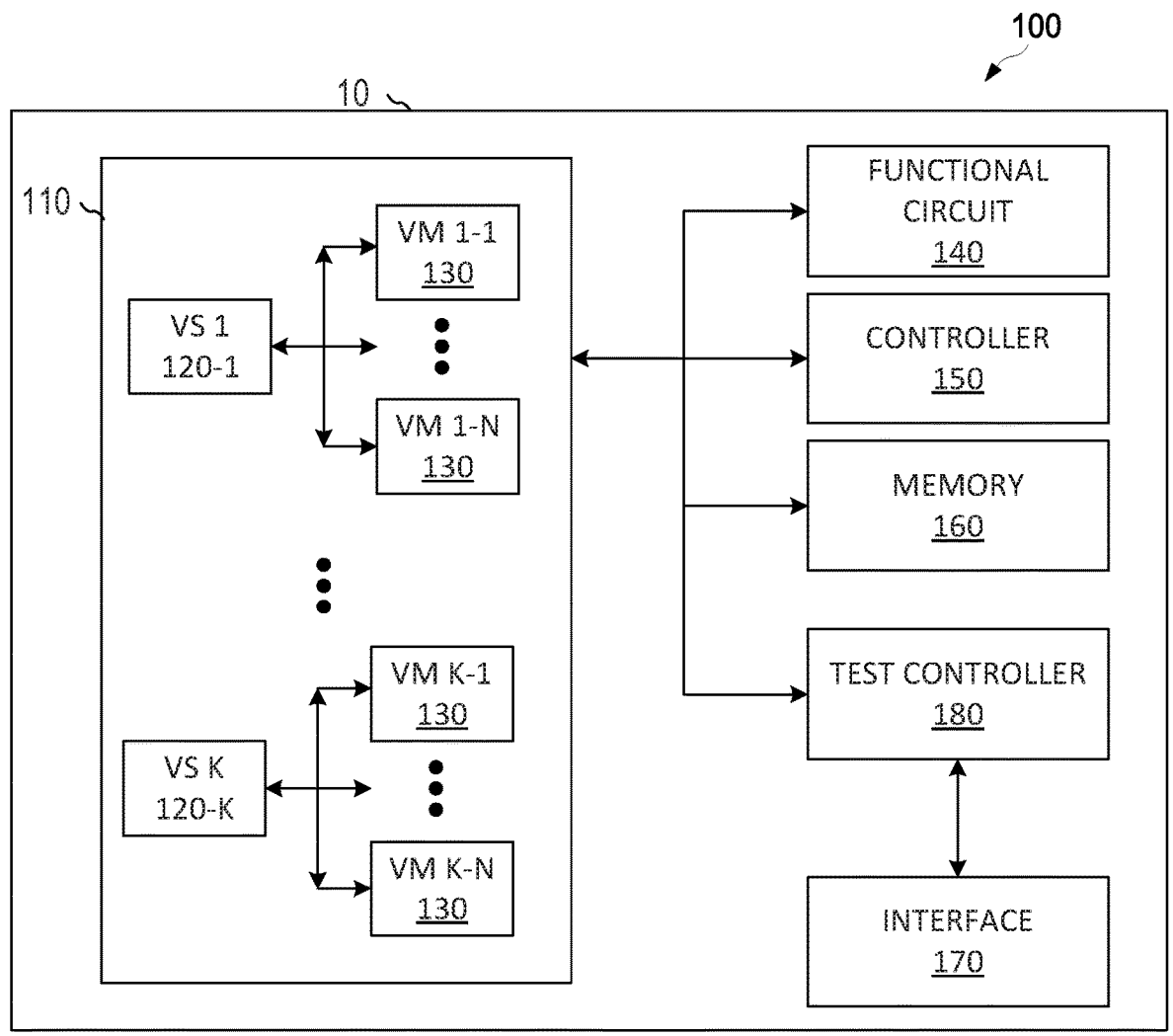
FIG. 1 is a block diagram of an embodiment device with a power management unit having multiple voltage supplies.

This disclosure provides many applicable inventive concepts that can be embodied in a wide variety of specific contexts. The specific embodiments are merely illustrative of specific configurations and do not limit the scope of the claimed embodiments. Features from different embodiments may be combined to form further embodiments unless noted otherwise. Variations or modifications described with respect to one of the embodiments may also be applicable to other embodiments. Further, it should be understood that various changes, substitutions, and alterations can be made herein without departing from the spirit and scope of this disclosure as defined by the appended claims.

The description below illustrates the various specific details to provide an in-depth understanding of several example embodiments according to the description. The embodiments may be obtained without one or more of the specific details, or with other methods, components, materials and the like. In other cases, known structures, materials, or operations are not shown or described in detail so as not to obscure the different aspects of the embodiments. References to "an embodiment" in this description indicate that a particular configuration, structure, or feature described in relation to the embodiment is included in at least one embodiment. Consequently, phrases such as "in one embodiment" that may appear at different points of the present description do not necessarily refer exactly to the same embodiment. Furthermore, specific formations, structures, or features may be combined in any appropriate manner in one or more embodiments.

In a device, a voltage monitor circuit may be used to monitor a supply voltage and provide an indication of the condition of the supply voltage, for example an over-voltage and/or an under-voltage condition. In response to a determined abnormal condition, by the voltage monitor circuit, the device may determine to correct the irregular condition by using, for example, a reset operation to protect the device from damage.

The voltage monitor circuit is calibrated by providing a trim code to a monitor reference of the voltage monitor circuit. The monitor reference, using the trim code, provides a targeted threshold voltage used to monitor the voltage provided by the supply voltage. Accordingly, improved techniques for testing the trim code and verifying the trim code value in voltage monitor circuits are desired.

Embodiments of this disclosure provide techniques for a reduced test time for verifying the integrity of the trimmed values of voltage monitor circuits over temperature, as well as for a reduced trimming operation.

Aspects of this disclosure provide embodiment operations for testing voltage monitor circuits in a device. In an embodiment, the entirety of the voltage monitor circuits are set to test mode and each monitor reference is programmed using a trim code provided from, for example, a memory component of the device. In one embodiment, an input voltage from a test voltage supply is ramped up between a first voltage and a second voltage. The voltages between the second voltage and the first voltage may include a first set of target threshold voltages of a first set of voltage monitor circuits.

In another embodiment, the input voltage from the test voltage supply is ramped down between a third voltage and a fourth voltage. The voltages between the fourth voltage and the third voltage may include a second set of target threshold voltages of a second set of voltage monitor circuits. The output of each voltage monitor circuit is monitored for a change in a logic state at the ramp up and ramp down operations for which the target threshold voltage corresponds in that voltage monitor circuit. For each voltage monitor circuit, the voltage from the test voltage supply at which the change in the logic state occurs corresponds to the targeted threshold voltage of the programmed trim code value. This value may be used to determine the accuracy of the targeted threshold voltage of the trimmed monitor reference. The operation may be repeated at varying temperatures to verify the integrity of the trimming across various environmental conditions of the device.

In other embodiments, techniques for a reduced trimming procedure for voltage monitor circuits is provided. In particular, a subset of voltage monitor circuits having a same targeted threshold voltage are selected for trimming. The input voltage provided to the subset of voltage monitor circuits is set to the targeted threshold voltage. Various trim code values are provided to each monitor reference to trigger a change in a logic state at the output of the voltage monitor circuit. The trim code value that caused the change in logic state at each respective voltage monitor circuit is used as the trim code value. These and other details are discussed in greater detail below.

FIG. 1 illustrates a block diagram 100 of a device 10, which may include a power management unit (PMU) no, a functional circuit 140, a controller 150, a memory 160, an interface 170, and a test controller unit 180, which may (or may not) be arranged as shown in FIG. 1. Each component in the device 10 may be a discrete component or arranged with one or more components in a single integrated circuit (IC). While illustrated schematically as a single unit, it is understood that the power management unit no could alternatively be distributed throughout the integrated circuit. The same applies to each of the other components.

In an embodiment, the test operations within the PMU no may be controlled by a test data register within the test controller unit 180. The test data register within test controller unit 180 can interface with the PMU no using, for example, interface 170. The interface 170 may be a joint test access group (JTAG) interface or the like. The test controller unit 180 may be a microprocessor, a digital signal processor, a field programmable gate array (FPGA), an application specific integrated circuit (ASIC), or the like.

As shown, the power management unit no may have multiple voltage supplies 120 (i.e., 120-1 to 120-K, with K being an integer greater than "1"). Each voltage supply 120 may have multiple voltage monitor circuits 130. Each voltage monitor circuit 130 is configured to monitor a different threshold voltage of a voltage supply 120. In some embodiments, multiple voltage monitor circuits 130 may be incorporated in a single integrated circuit (IC) in, for example, a system on chip (SOC) device. As an example, a power management unit may have a first voltage supply operating over a range of 2.7 volts (V) to 6 V, a second voltage supply operating over a range of 1.5 V to 2.4 V, and a third voltage supply operating over a range of 0.7 V to 1.15 V. In this example, the first voltage supply may have associated voltage monitor circuits corresponding with threshold voltages of 2.7 V, 3.0 V, 3.3 V, . . . , and 6 V; the second voltage supply may have associated voltage monitor circuits corresponding with threshold voltages of 1.5 V, 1.6 V, 1.7 V, . . . , 2.4 V; and the third voltage supply may have associated voltage monitor circuits corresponding with threshold voltages of 0.7 V, 0.8 V, 0.9 V, . . . , 1.15 V.

The functional circuit 140 may be any circuit that uses the power management unit no as a power source for operations. The controller 150 may be a microprocessor, a digital signal processor, a field programmable gate array (FPGA), an application specific integrated circuit (ASIC), or the like, that may be formed on the same or a different substrate with one or more components of the power management unit no. The controller 150 may be used to operate the functional operations of the power management unit no and the functional circuit 140. The memory 160 may include any type of non-transitory system memory such as static random access memory (SRAM), dynamic random access memory (DRAM), synchronous DRAM (SDRAM), read-only memory (ROM), or a combination thereof. The memory 160 may be used to store instructions for the controller 150 or configuration settings of various components of the power management unit no. As an example, the trim settings of each voltage monitor may be stored in the memory 160.

Figure 2:
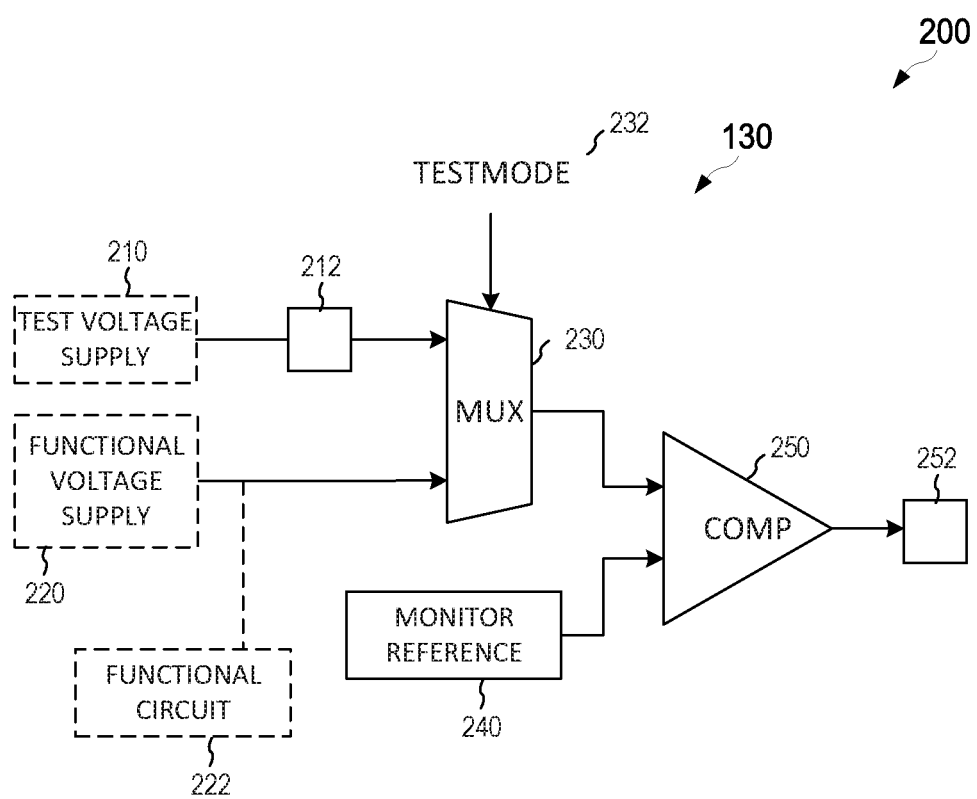
FIG. 2 is a block diagram of an embodiment voltage monitor circuit.

FIG. 2 illustrates a block diagram 200 of an embodiment voltage monitor circuit 130. The voltage monitor circuit 130 includes a multiplexer 230 and a comparator 250, which may (or may not) be arranged as shown in FIG. 2.

During functional operation, a functional voltage supply 220, in addition to providing the functional voltage to the functional circuit 222, provides a functional voltage to a first input terminal of the multiplexer 230.

During test operations, a test voltage supply 210 provides a test voltage, via the pad 212, to a second input terminal of the multiplexer 230.

A test mode select signal 232 is supplied to the multiplexer 230 to assert a test mode or a functional mode operation of the voltage monitor circuit 130. Based on the value of the test mode select signal 232, the multiplexer 230 becomes a pass through circuit for a voltage supplied by either the test voltage supply 210 or the functional voltage supply 220.

As an example, in response to the test mode select signal 232 being equal to a binary value of "0," corresponding with the voltage monitor circuit 130 being in functional mode, the multiplexer 230 outputs the voltage of the functional voltage supply 220. Conversely, in response to the test mode select signal 232 being equal to a binary value of "1," corresponding with the voltage monitor circuit 130 being in test mode, the multiplexer 230 outputs the voltage of the test voltage supply 210.

The monitor reference 240 is trimmed, during the trimming process, to a targeted threshold voltage. In some embodiments, the trim value for the voltage monitor circuit 130 may be provided by a memory unit. In an embodiment, the trimming operation in a device having multiple voltage monitor circuits may comprise individually selecting each voltage monitor circuit at a time and varying the trim bit to check monitor trip point.

The comparator 250 compares the pass through voltage provided by the multiplexer 230 with a targeted threshold voltage from the monitor reference 240.

During functional operation, the comparator 250 compares the voltage from the functional voltage supply 220 to the targeted threshold voltage. The comparator 250 provides a digital signal indicative of whether the voltage from the functional voltage supply 220 is greater or less than the targeted threshold voltage. A change in the logical value of the digital signal indicates that the voltage from functional voltage supply 220 has exceeded or fallen below the targeted threshold. This may be used to indicate an over-voltage or under-voltage condition, based on the voltage that the voltage monitor circuit is monitoring, of the functional voltage supply 220.

During test operation, the comparator 250 receives, as input signals, the voltage of the test voltage supply 210 and the targeted threshold voltage from the monitor reference 240. Accordingly, the comparator 250 outputs a digital signal, at the pad 252, indicating which of the two inputs voltages is larger. During a ramp up or ramp down of the voltage from the test voltage supply 210, a change in logic value of the digital signal may be used to indicate the trimmed value of the voltage from the monitor reference. Thus, the digital signal at pad 252 may be used to determine whether the trimmed targeted threshold voltage, from the monitor reference 240, functions properly in reference to a known input voltage from the test voltage supply 210. Moreover, during production test verification and to verify that the trimmed target threshold voltage from the monitor reference 240 is properly set across the entire operational environmental conditions, the test may be repeated over temperature.

Figure 3:
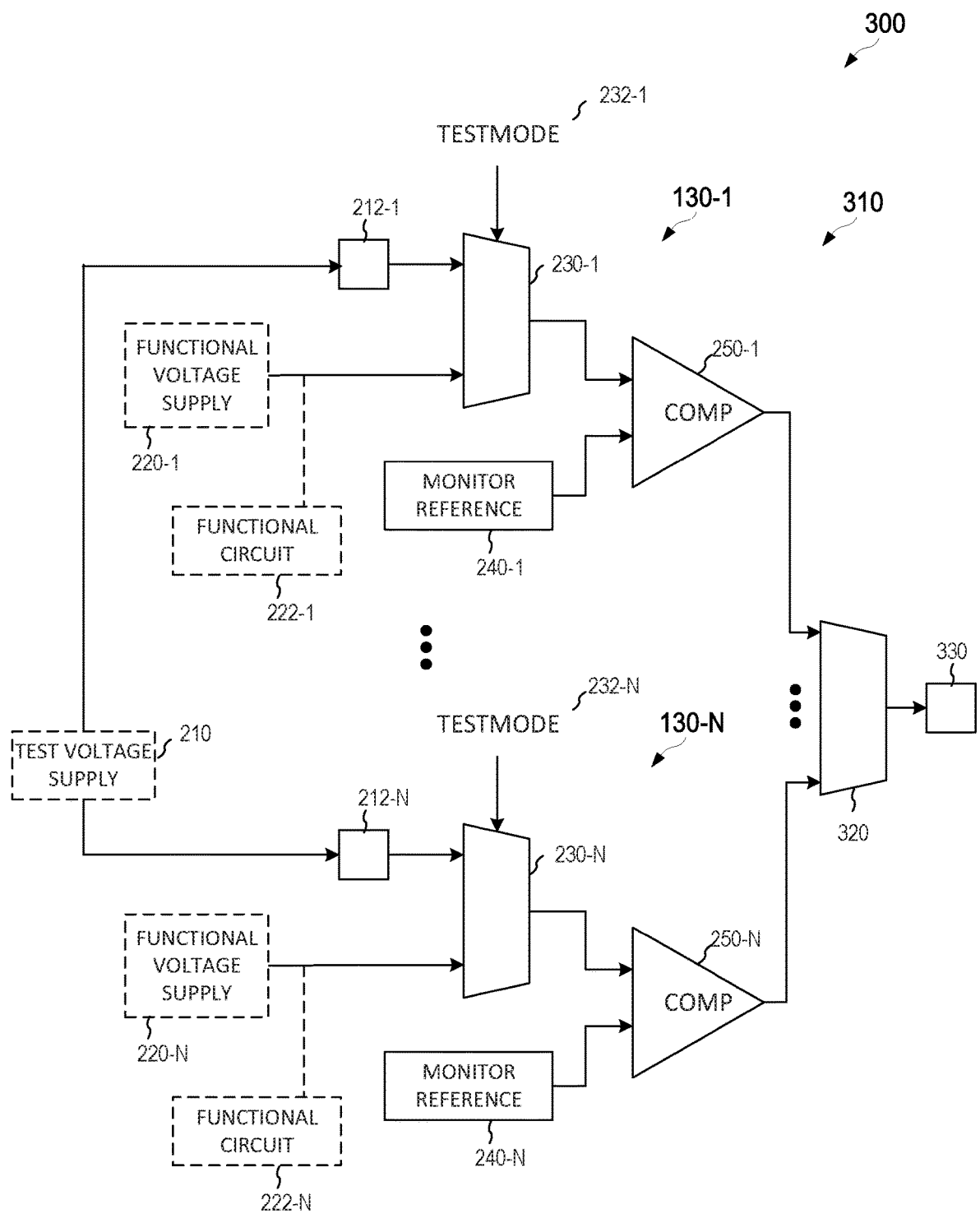
FIG. 3 is a block diagram of a prior art testing system in a device with multiple voltage monitor circuits.

FIG. 3 illustrates a block diagram 300 of a prior art testing system used to verify trimmed target threshold voltages of a device 310 with multiple voltage monitor circuits 130-1, ..., 130-N. The block diagram 300 is shown to have N number voltage monitor circuits 130 identified as 130-1 to 130-N, where N is any integer greater than one. For the sake of simplifying the discussion, FIG. 3 is simply showing a first and a last voltage monitor circuit of the device 310.

With reference to FIG. 3, a prior art implementation operation of the verification of the multiple voltage monitor circuits of device 310 is described. At an initial step, the device 310 is powered up. The default operating condition of the device 310, after power-up, is the functional mode operation. Accordingly, the test mode select signal (i.e., 232-1, 232-2, ..., 232-N) for each voltage monitor circuit 130 is a binary value of "0."

In a first instance of a looping operation, the first voltage monitor circuit 130-1, under trimmed conditions, is programmed to operate in test mode, while the remaining voltage monitor circuits (i.e., 130-2, 130-3, ..., 130-N) remain in functional mode. This is done by setting the test mode select signal 232-1 to a binary value of "1," while keeping the remaining test mode select signals (i.e., 232-2, 232-3, ..., 232-N) at the binary value of "0."

The digital multiplexer 320 is set, for example using a test signal, to map the output of the comparator 250-1 of the first voltage monitor circuit 130-1 to the pad 330. In some embodiments, the test signal select of the digital multiplexer 320 may correspond to the test mode select signal 232 of the voltage monitor circuit 130 under test.

The voltage of the test voltage supply 210 is ramped up or down, from a first voltage to a second voltage, covering the threshold voltage that the first voltage monitor circuit 130-1 is configured to monitor.

During the ramping of the voltage, the pad 330 is monitored for a change in logical state of the output of the comparator 250-1. The voltage of the test voltage supply 210, corresponding to the change in logical state, provides an observed value for the threshold voltage set for the voltage monitor circuit 130-1.

The loop is repeated for the next voltage monitor circuit (e.g., 130-2) until all voltage monitor circuits 130 have been tested. The test can subsequently be repeated at various temperatures (e.g., hot, cold, etc.) to verify the trimmed value of each voltage monitor circuit 130 across various temperature conditions.

In some embodiments, the voltage is ramped from a lower voltage to a higher voltage value. In other embodiments, the voltage is ramped from a higher voltage to a lower voltage value. The direction of the voltage ramping may correspond to the threshold voltage being monitored by the a voltage monitor circuit 130 and the purpose that the respective voltage monitor circuit serves in the device 310.

In embodiments, the remaining voltage monitor circuits in functional mode operation are set to monitor their respective functional supply voltages corresponding to the fully functional operation of the device 310.

As each voltage monitor circuit 130 is tested individually, a significant time is allotted to verify the integrity of the trimmed values in the prior art testing system. To determine the integrity of the trimmed values across multiple temperature conditions, the total time is multiplied by the number of different test temperature conditions.

As an example, in a device with 50 voltage monitor circuits, a test ramp may require about 80 milliseconds (ms) to go from a first voltage to a second voltage. Accordingly, a total test time to verify all fifty voltage monitor circuits at each temperature condition would require about 4 seconds. To test all voltage monitor circuits at hot and cold temperatures, the total test time is about 8 seconds.

The above discussed time constraint and other issues of prior art testing system are addressed with the embodiments of this disclosure.

Figure 4:
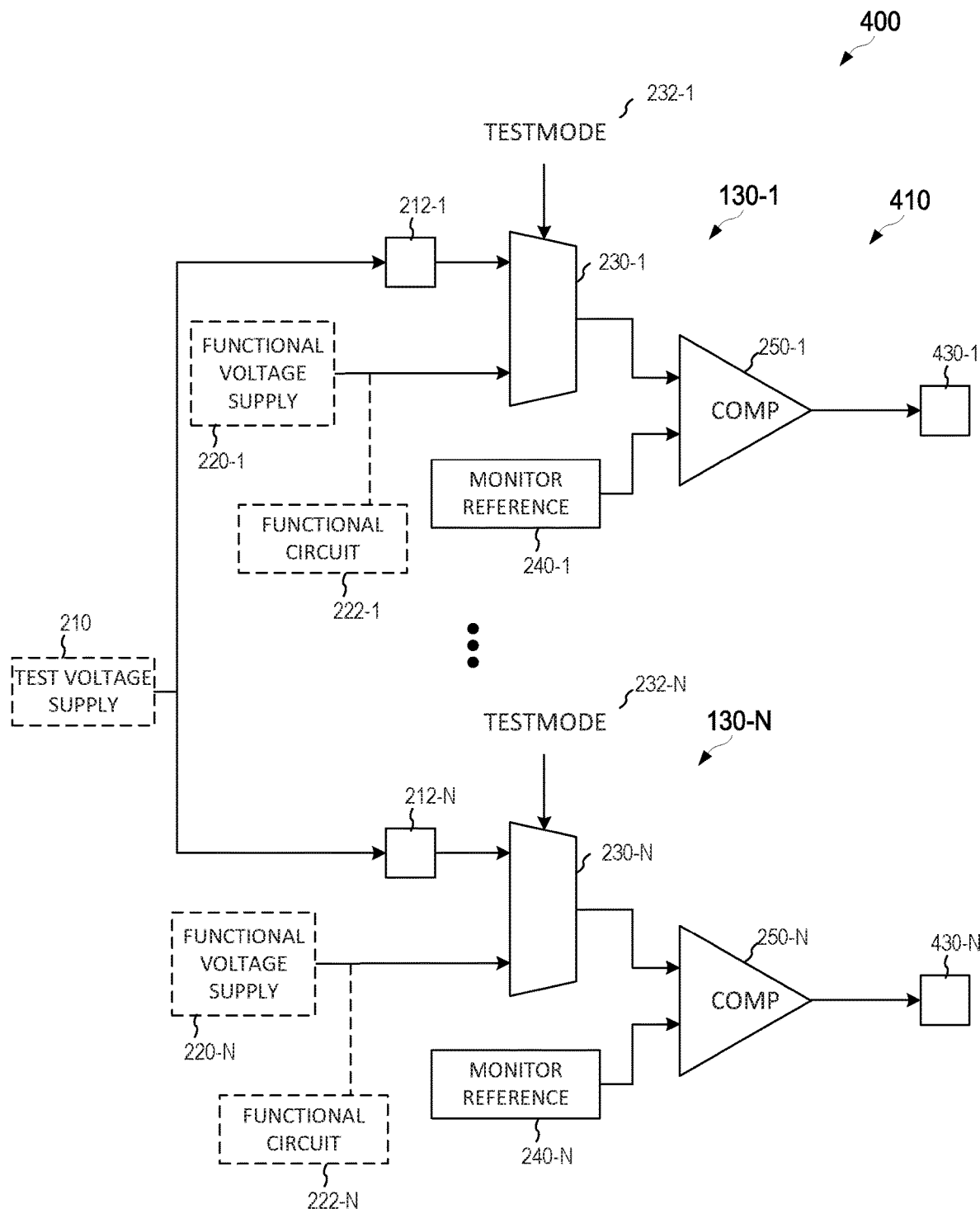
FIG. 4 is a block diagram of an embodiment testing system in a device with multiple voltage monitor circuits.

FIG. 4 illustrates a block diagram 400 of an embodiment testing system used to verify trimmed target threshold voltages of a device 410 with multiple voltage monitor circuits 130-1, ..., 130-N. Similar to FIG. 3, the block diagram 400 is shown to have N number voltage monitor circuits 130 identified as 130-1 to 130-N, where N is any integer greater than one. For the sake of simplifying the discussion, FIG. 4 is simply showing a first and last voltage monitor circuit of the device 410.

With reference to FIG. 4, a proposed operation of the verification of the multiple voltage monitor circuits of device 410 is now described. At an initial step, the device 410 is powered up. The default operating condition of the device 410, after power-up, is in the functional mode operation. Accordingly, the test mode select signal (i.e., 232-1, 232-2, ..., 232-N) for each voltage monitor circuit 130 is a binary value of 0.

In contrast to the prior art operation, discussed with respect to FIG. 3, the entirety of the voltage monitor circuits, under trimmed conditions, are programmed to operate in test mode. This is done by setting the test mode select signals 232-1 to 232-N to a binary value of "1."

The output of a respective comparator of each voltage monitor circuit 130 is mapped to a pad 430 (i.e., the output of the first voltage monitor circuit 130-1 is mapped to pad 430-1, the output of the second voltage monitor circuit 130-2 is mapped to pad 430-2, and so forth).

The proposed operation includes a rising ramp and a falling ramp operation. The rising ramp operation corresponds to the testing of the upper range of voltages and the falling ramp operation corresponds to the testing of the lower range of voltages. Accordingly, the voltage of the test voltage supply 210 is ramped up (i.e., rising ramp) and subsequently ramped down (i.e., falling ramp) to cover the entirety of the voltages monitored by the voltage monitor circuits 130.

During each ramping of the voltage, each pad 430 is monitored for a change in logical state of an output of a voltage monitor circuit 130. The voltage of the test voltage supply 210, corresponding to the change in logical state, provides an observed value for the threshold voltage set for each voltage monitor circuit 130.

In an embodiment, all voltage monitor circuits configured for a first group of voltage monitor circuits (e.g., high or upper voltages) are tested during the rising ramp operation and a second group of voltage monitor circuits (e.g., minimum or low voltages) are tested during the falling ramp operation. In some embodiments, the first group of voltage monitor circuits may be tested with a first test supply voltage and the second group of voltage monitor circuits may be tested with a second test supply voltage. Each test supply voltage is accordingly ramped up or ramped down at the same time to test all voltage monitor circuits 130 at approximately a same time. This advantageously reduces test time by a factor of 2.

This parallel testing operation is repeated at various temperatures (e.g., hot, cold, etc.) to verify the trimmed value of each voltage monitor circuit 130 across various temperature conditions.

In view of the prior art testing solution, the proposed solution provides a parallel monitoring operation that significantly reduces test time.

Returning to the example presented, with respect to FIG. 3, the current solution includes two test ramps at 80 ms each for each temperature. To test the entirety of the voltage monitor circuits 130, the total test time is about 320 ms, which in reference to the previous solution provides a time savings of about 7.68 seconds.

In some embodiments, a voltage monitor list may be provided indicating a difference between the targeted threshold voltage and the trigger point for each voltage monitor circuit.

Figure 5:
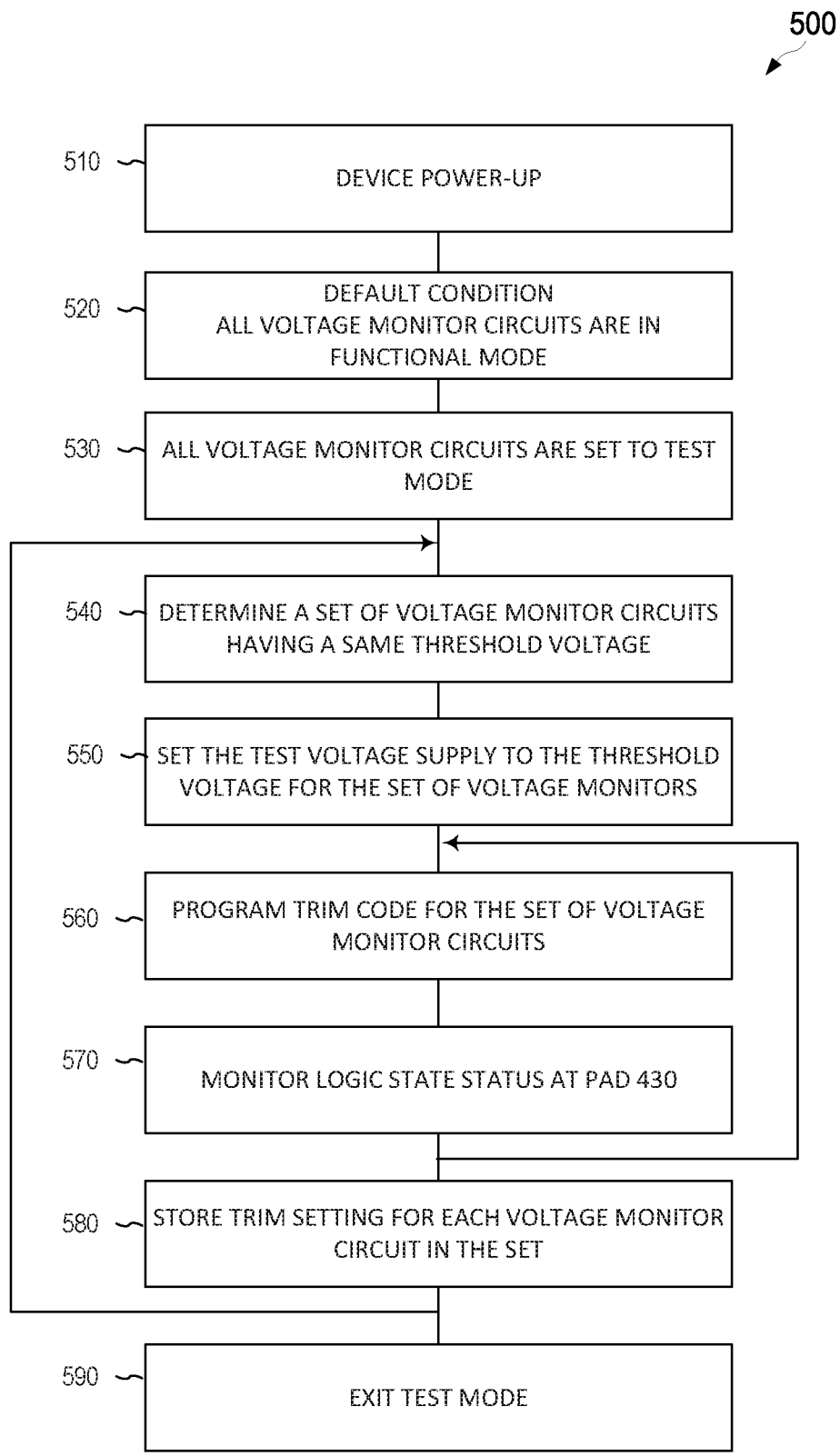
FIG. 5 is a flow diagram of an embodiment trimming process for trimming batches of voltage monitor circuits in a device.

FIG. 5 illustrates a flow diagram 500 of an embodiment trimming process in a device having multiple voltage monitor circuits 130. In a prior art trimming operation, each voltage monitor circuit 130 is trimmed one at a time. One by one, each voltage monitor circuit 130 is placed into test mode. A targeted voltage, corresponding to the targeted threshold voltage, is set at the test voltage supply 210. The trim value for each monitor reference 240 is varied and the digital output at the pad 252 is monitored. The set trim value is determined by a change in the logical value of the digital output. In some embodiments, the trim value may be stored in the memory 160 and the monitor reference 240 may be programmed during power up operations.

A proposed alternative to the prior art trimming operation is proposed. As shown in FIG. 5, the device is powered-up at step 510. At step 520, in the default power-up condition, the voltage monitor circuits 130 are initially in functional mode operation. The functional mode operation is set by asserting a functional mode setting via the test mode select signal 232.

At step 530, the entirety of the voltage monitor circuits 130 are set to test mode. The test mode operation may be set by asserting a test mode setting via the test mode select signal 232. The output of each voltage monitor circuit 130 is mapped to a pad 430 (i.e., 430-1, 430-2, etc.). Each pad 430 is monitored for a change in logic signal.

In a loop operation, at step 540, a first set of voltage monitor circuits 130 sharing a same targeted threshold voltage are selected. At step 550, the test voltage supply 210 is set at the targeted threshold voltage. At step 560, the trim code for each monitor reference 240 is set. At step 570, the logic state at the pad 430 is monitored. The process from step 560 is repeated by changing the value of the trim code until the logic state at pad 430 is changed. At step 580, the trim code for each voltage monitor circuit 130 in the set is stored in a memory 160. In some embodiments, the associated trim code for each voltage monitor circuit is programmed in a memory device (e.g., non-volatile memory (NVM)) of the power management unit. Steps 540, 550, 560, and 570 are repeated until the trim code for all voltage monitor circuits have been determined. At step 580, the device exits test mode.

The proposed trimming solution provides a shortened test time in view of prior art trimming operations. In an embodiment, each trim code value in the loop is provided from a test data register using a joint test action group (JTAG) interface.

Although the description has been described in detail, it should be understood that various changes, substitutions, and alterations may be made without departing from the spirit and scope of this disclosure as defined by the appended claims. The same elements are designated with the same reference numbers in the various figures.

Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for testing voltage monitor circuits in a device, the method comprising:
setting voltage monitor circuits to test mode;
setting a monitor reference in each voltage monitor circuit to a respective targeted threshold voltage using a corresponding trim code stored in a non-transitory memory storage of the device;
ramping a voltage provided to a subset of voltage monitor circuits from a first voltage to a second voltage using a test voltage supply, voltages between the first voltage and the second voltage corresponding with targeted threshold voltages of the subset of voltage monitor circuits;
determining for each voltage monitor circuit in the subset of voltage monitor circuits a voltage value of the test voltage supply resulting in a change in a logic state at an output of a corresponding voltage monitor circuit; and
verifying for each voltage monitor circuit in the subset of voltage monitor circuits that the determined voltage value for the each voltage monitor circuit corresponds to the respective targeted threshold voltage of an associated voltage monitor circuit and, based thereon, indicating whether the trim code is set correctly.

2. The method of claim 1, wherein the second voltage is a voltage greater than the first voltage and corresponding to a ramping up of the test voltage supply.

3. The method of claim 1, wherein the first voltage is a voltage greater than the second voltage and corresponding to a ramping down of the test voltage supply.

4. The method of claim 1, wherein, in each voltage monitor circuit, the monitor reference is compared to the voltage provided from the test voltage supply using a comparator circuit, the change in the logic state corresponding to a change in a digital state of an output of the comparator circuit.

5. The method of claim 1, further comprising setting an operating temperature of the voltage monitor circuits to a minimum operating temperature or a maximum operating temperature of the device before ramping the voltage provided to the subset of voltage monitor circuits.

6. The method of claim 1, wherein the subset of voltage monitor circuits comprises minimum voltage detectors, low voltage detectors, high voltage detectors, or upper voltage detectors.

7. The method of claim 1, wherein each voltage monitor circuit comprises a multiplexer having a first input coupled to the test voltage supply and a second input coupled to a functional voltage supply, the functional voltage supply providing a voltage monitored by the voltage monitor circuit during functional mode.

8. A device, comprising:
a plurality of voltage monitor circuits, each voltage monitor circuit comprising an associated monitor reference;
a non-transitory memory storage comprising instructions;
a processor in communication with the non-transitory memory storage, wherein the processor is configured to execute the instructions to:
set the voltage monitor circuits to test mode;
set the associated monitor reference in each voltage monitor circuit to a respective targeted threshold voltage using a corresponding trim code;
set an operating temperature of the voltage monitor circuits to a minimum operating temperature or a maximum operating temperature of the device;
ramp a voltage provided to a subset of voltage monitor circuits from a first voltage to a second voltage using a test voltage supply, voltages between the first voltage and the second voltage corresponding with targeted threshold voltages of the subset of voltage monitor circuits;
determine for each voltage monitor circuit in the subset of voltage monitor circuits a voltage value of the test voltage supply resulting in a change in a logic state at an output of a corresponding voltage monitor circuit; and
verify that the determined voltage value for each voltage monitor circuit in the subset of voltage monitor circuits corresponds to the respective targeted threshold voltage of an associated voltage monitor circuit and, based thereon, indicate whether or not the trim code is set correctly.

9. The device of claim 8, wherein the second voltage is a voltage greater than the first voltage and corresponding to a ramping up of the test voltage supply.

10. The device of claim 8, wherein the first voltage is a voltage greater than the second voltage and corresponding to a ramping down of the test voltage supply.

11. The device of claim 8, wherein the associated monitor reference is compared to the voltage provided from the test voltage supply in each voltage monitor circuit using a comparator circuit, the change in the logic state corresponding to a change in a digital state of an output of the comparator circuit.

12. The device of claim 8, wherein a trim code for each voltage monitor circuit is stored in the non-transitory memory storage, the setting the associated monitor reference in each voltage monitor circuit comprises setting the monitor reference with a corresponding trim code from the non-transitory memory storage.

13. A device comprising:
a plurality of voltage monitor circuits configured to operate in a test mode setting;
a non-transitory-memory storage comprising instructions and a trim code for each voltage monitor circuit;
a processor in communication with the voltage monitor circuits and the non-transitory memory storage, wherein the instructions when executed by the processor, cause the processor to:
set an associated monitor reference in each voltage monitor circuit to a respective targeted threshold voltage using a corresponding trim code stored in the non-transitory memory storage;
ramp a voltage provided to a subset of voltage monitor circuits from a first voltage to a second voltage using a test voltage supply, voltages between the first voltage and the second voltage corresponding with targeted threshold voltages of the subset of voltage monitor circuits;
determine for each voltage monitor circuit in the subset of voltage monitor circuits a voltage value of the test voltage supply resulting in a change in a logic state at an output of a corresponding voltage monitor circuit; and
verify that the determined voltage value for each voltage monitor circuit in the subset of voltage monitor circuits corresponds to the respective targeted threshold voltage of an associated voltage monitor circuit and, based thereon, indicating whether or not the trim code is set correctly.

14. The device of claim 13, wherein the second voltage is a voltage greater than the first voltage and corresponding to a ramping up of the test voltage supply.

15. The device of claim 13, wherein the first voltage is a voltage greater than the second voltage and corresponding to a ramping down of the test voltage supply.

16. The device of claim 13, wherein the associated monitor reference is compared to the voltage provided from the test voltage supply in each voltage monitor circuit using a comparator circuit, the change in the logic state corresponding to a change in a digital state of an output of the comparator circuit.

17. The device of claim 13, wherein the test mode setting further comprises setting an operating temperature of the voltage monitor circuits to a minimum operating temperature or a maximum operating temperature of the device before ramping the voltage provided to the subset of voltage monitor circuits.

18. The device of claim 8, wherein each voltage monitor circuit comprises a multiplexer having a first input coupled to the test voltage supply and a second input coupled to a functional voltage supply, the functional voltage supply providing a voltage monitored by the voltage monitor circuit during functional mode.

19. The device of claim 8, wherein the subset of voltage monitor circuits comprises minimum voltage detectors, low voltage detectors, high voltage detectors, or upper voltage detectors.

20. The device of claim 13, wherein the subset of voltage monitor circuits comprises minimum voltage detectors, low voltage detectors, high voltage detectors, or upper voltage detectors.

* * * * *

UNITED STATES PATENT AND TRADEMARK OFFICE
CERTIFICATE OF CORRECTION

PATENT NO. : 11,340,292 B2
APPLICATION NO. : 16/506264
DATED : May 24, 2022
INVENTOR(S) : Narwal et al.

It is certified that error appears in the above-identified patent and that said Letters Patent is hereby corrected as shown below:

In the Claims

Claim 8, Column 11, Line 54; delete "or not".

Signed and Sealed this
Fifth Day of July, 2022

Katherine Kelly Vidal
*Director of the United States Patent and Trademark Office*